United States Patent [19]

Paggen et al.

[11] Patent Number: 5,063,477
[45] Date of Patent: Nov. 5, 1991

[54] FRAME FOR CIRCUIT BOARDS WITH ELECTRONIC COMPONENTS

[75] Inventors: Wolfgang Paggen, Starnberg; Josef Neblich, Wartenberg, both of Fed. Rep. of Germany

[73] Assignee: Knurr-Mechanik fur die Elektronik Aktiengesellschaft, Munich, Fed. Rep. of Germany

[21] Appl. No.: 432,507

[22] Filed: Nov. 7, 1989

[30] Foreign Application Priority Data

Nov. 7, 1988 [DE] Fed. Rep. of Germany ....... 3837744

[51] Int. Cl.⁵ .............................................. H05K 7/20
[52] U.S. Cl. ................................... 361/384; 361/381; 361/396
[58] Field of Search ............... 361/381, 383, 384, 390, 361/396

[56] References Cited

U.S. PATENT DOCUMENTS 3,699,208 10/1987 Wolf et al. .......................... 361/384
4,758,925 7/1988 Obata et al. .......................... 361/384

FOREIGN PATENT DOCUMENTS 2844672 4/1980 Fed. Rep. of Germany ...... 361/384
3423992 1/1986 Fed. Rep. of Germany ...... 361/384

Primary Examiner—Gregory D. Thompson
Attorney, Agent, or Firm—Fleit, Jacobson, Cohn, Price, Holman & Stern

[57] ABSTRACT

The frame has a reception area for receiving plug-in cards or circuit boards and a forced ventilation for the reception area. The forced ventilation is provided by a blower arrangement, as well as an air distributor and air collector, by which a vertical cooling air flow through the gaps of the plug-in cards is produced. The air distributor and air collector are juxtaposed in the depth of the frame and separated from one another by a cooling baffle passing diagonally from top to bottom. The outlet-side opening of the distirbutor is located in the frame cover. When several frames are stacked, this opening cooperates with an inlet arranged in the bottom of the frame for the reception area of the frame place at the top.

5 Claims, 1 Drawing Sheet

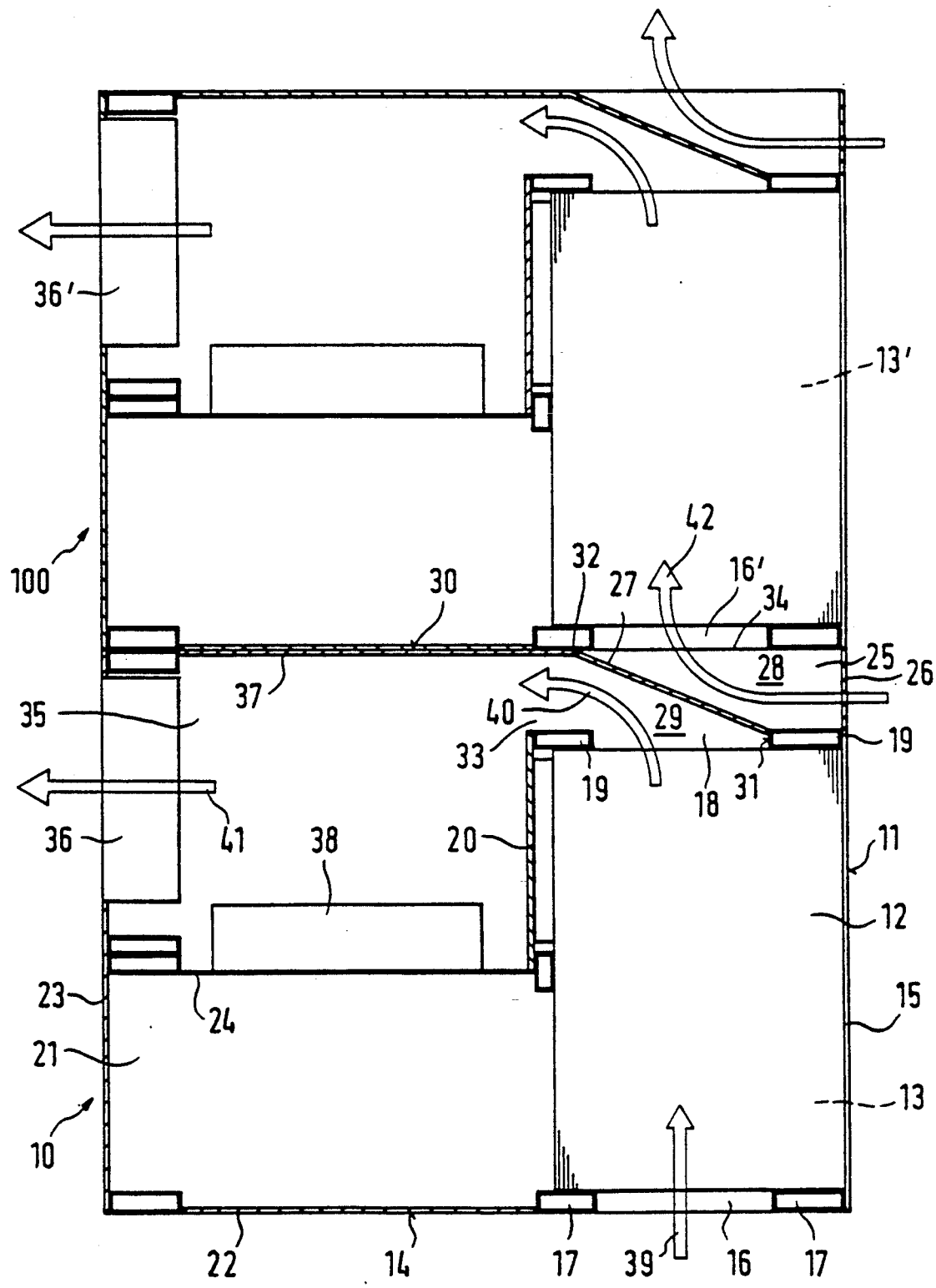

FRAME FOR CIRCUIT BOARDS WITH ELECTRONIC COMPONENTS

BACKGROUND OF THE INVENTION

The invention relates to a frame with a reception area for a plurality of vertically arranged circuit boards carrying electronic components, in which the reception area is provided on its top and bottom with an air inlet and air outlet and is closed in airtight manner on the other sides and is provided with a forced ventilation of the reception area by means of a blower system, with which a cooling air flow is produced from the air inlet to the air outlet.

As is known, such frames are used in large numbers in the modular construction of electronic equipment and installations. They are used on the one hand for mechanical reception and on the other for the electrical connection of assemblies and circuit boards, which are dimensionally matched to one another by predetermined grids or rasters and spacing steps. A standard format is the 19" system.

The dissipated heat produced by the electronic components on the circuit boards must be removed by cooling. For this purpose there is a through ventilation of the circuit boards by means of a ventilator arrangement, in that cool external air is sucked in and the heated air is discharged to the outside again. Thus, in the case of closed systems, there is a forced circulation by internal ventilators.

Frequently the ventilators are located in the rear wall of the frame and cooling air is sucked in by means of openings in the front of the frame. German Utility Model 87 13766 discloses such a frame, in which below the assembly reception area is provided a distributing area, which is connected to a front opening. Above the reception area is located an air collecting area, from which the heated air is sucked rearwards by means of an axial-flow fan and blown out. The height of the distribution area and the collecting area corresponds in each case to half one height unit, whilst the reception area or the circuit boards inserted therein is two height units of the 19" system. Particularly if the circuit boards are closely juxtaposed and therefore the gaps are small, the fact that the individual circuit boards are provided with a varying number of components means that on the one hand restricting constructions and on the other relatively large openings in the cross-sectional surface of the reception area. If, as in the known example, the distributor is too small relative to the reception area volume, the sucked in cooling air prefers to flow through those gaps having a wide cross-section, whereas the air flow in the constricted gaps is relatively small. Thus, there is an inadequate ventilation of the most densely equipped circuit boards, where the greatest amount of dissipated heat is produced.

SUMMARY OF THE INVENTION

The object of the invention is to provide a frame of the aforementioned type, in which a uniform air flow between all the circuit boards is ensured.

According to the invention this is achieved in that the reception area is directly adjacent to the bottom of the frame, that above the reception area in the depth of the frame the collector and distributor area are juxtaposed and separated from one another by a cooling baffle running diagonally from top to bottom in such a way that the distributor covers the entire front air intake between the upper edge of the reception area and the frame, as well as a cover-side opening of the frame extending substantially over the entire horizontal cross-sectional surface of the reception frame, and that the collector contains the entire top horizontal air outlet of the reception area and the vertical, inner connecting opening to the blower arrangement located between the upper edge of the reception area and the frame.

The invention has the advantage that the effective cross-section of the distributor and the collector is optimized relative to the available suction area. A basic principle of the invention is that the distributor arranged in a frame is not provided for the latter, but for further frames stacked thereon. As a result of this distribution, which has its effect in the case of modular, stacked arrangement of several frames, it is possible to utilise the existing space without any cross-sectional loss. The distributor volume can be made so large that a backpressure is produced by the constricting action of the circuit boards and this tends to decrease accompanied by uniform pressure distribution over the individual board gaps. Thus, a uniform forced cooling of all the components is obtained.

According to a preferred further development of the invention, the height of the distributor or collector is one height unit in the 19" system. The available cross-section is adequate to reliably ventilate a reception area filled with circuit boards with six height units according to the 19" system.

According to a further preferred development of the invention, the diagonally located cooling baffle is extended on the cover-side of the frame upto the rear wall of the latter. This has the advantage that the forced ventilation of the reception area or air suction is also ensured if the frame is not in a stack union with the other frames. The cooling baffle extending up to the wall seals the frame between the collector and ventilator against external air.

In the stack union sealing preferably takes place by a frame base plate, which extends from the reception area to the back.

In principle, a cooling baffle or a base plate is highly suitable. However, in place of metallic materials, it is obviously possible to use some other sealing, flexurally rigid material, such as e.g. plastic.

The invention is described in greater detail hereinafter relative to an embodiment shown in the drawing.

BRIEF DESCRIPTION OF THE DRAWING

The single drawing diagrammatically shows a vertical cross-section through two superimposed frames.

DESCRIPTION OF THE PREFERRED EMBODIMENT

In the drawing 10 is a lower frame and 100 an identical, upper frame placed on the lower frame 10. As the constructional details of the upper and lower frames 10, 100 are identical, the following description will be limited to the lower frame 10, but these details can also be attributed to the upper frame 100.

Frame 10 is a modular unit according to the 19" system. In the represented embodiment it has seven height units of the 19" system. From the front panel 11 of the frame 10 shown to the right plug-in cards are vertically inserted and provided with electronic components (not shown). The plug-in cards 12 in each case have six height units of the 19" system. They are located in a reception area 13, which extends from the underside 14 of frame 10 by six height units, so that a gap of one height unit, whose function will be explained in detail hereinafter, is left between the top of the reception area 13 and the top of frame 10.

Each of the plug-in cards 12 is provided with a front plate or panel 15 running at right angles to the plane of the drawing and which is sufficiently wide that on completely filling the reception area 13 over six height units a closed front surface is formed. The underside of reception area 13 is provided with an air inlet 16 extending substantially between lower fixing rails 17 for plug-in cards 12 over the entire width and depth of the reception area in the casing bottom 14. A substantially identical air outlet 18 is located opposite air inlet 16 on the top of reception area 13 between the top fixing rails 19. The depth of the reception area 13 results from the width of the plug-in cards 12. Towards the rear, the reception area 13 is separated in airtight manner from the remaining interior of the frame 10 by a cover plate 20. In the represented embodiment, cover plate 20 extends over the upper three height units of the reception area. The lower three height units are connected to an otherwise airtight closed cavity 21 of frame 10. Cavity 21 is downwardly bounded by a base plate 22 inserted in frame 10 and rearward by a rear wall 23 and upwards by a partition 24.

This leads to convection between air inlet 16 and air outlet 18 through the gaps of the plug-in cards 12.

The space 25 above the reception area 13 is frontally provided with a ventilation grating 26, which extends over the entire width of the frame 10 at right angles to the plane of the drawing. The ventilation grating 26 is e.g. constructed as a perforated front panel.

Space 25 is also subdivided in airtight manner by a cooling baffle 27 into an air distributor 28 and an air collector 29. For this purpose cooling baffle 27 extends from the top 30 of frame 10 to the front edge 31 of air outlet 18 in such a way that space 25 is diagonally subdivided.

The top face point 32 of the cooling baffle 27 is located roughly at a distance from the front panel 11, which corresponds to the depth of the reception area 13. In this way on the collector side the cooling baffle 27 covers the entire horizontal air outlet 18 and a vertical opening 33, which has the same cross-sectional surface as the ventilation grating 26 and faces the latter. On the distributor side the cooling baffle 27 covers the front opening associated with the ventilation grating 26 and a top casing opening or air outlet 34. The drawing makes it clear that the casing opening 34 coincides with the air inlet 16 of the frame 10. In the stacked arrangement there is consequently also coincidence between the casing opening 34 of the lower frame 10 and the bottom air inlet 16' of the upper frame 100.

The air collector 29 located in the lower frame 10 is consequently used for supplying the reception area 13' of the frame 100 positioned above it. It is clear that the stacking is not limited to the two frames 10, 100 shown and that instead a random stack height is possible.

By means of a further cavity or rear reception area 35, opening 33 is subject to the action of an axial-flow fan 36 arranged in a suitable air outlet (not shown) in rear wall 23. For example, a main part 38 for the supply of the plug-in cards 12 can be located in cavity 35, which is sealed in airtight manner at the bottom by partition 24, towards the reception area 13 by cover plate 20 and upwards by an extension 37 of cooling baffle 27 passing along the assembly top 30. The axial-flow fan can be replaced by any other fan or ventilator type. If the axial-flow fan 36 produces a vacuum, then according to arrow 39 air is sucked into reception area 13 and in the case of the lower frame 10 this takes place directly by means of the bottom air inlet 16. The sucked in air flows via air collector 29 according to arrow 40 out of the reception area 13 and is blown out via axial-flow fan 36 in accordance with arrow 41. On switching on the associated axial-flow fan 36', for the stacked, upper frame 100 air is sucked in according to arrow 42 via the air collector 29 of the underlying frame 10. It passes from there via the air inlet 16' into reception area 13'. It is important that through the relatively large collector-side opening 33 and the equally large opening acting on the ventilator side and provided with the ventilation grating 26, a large volume flow is produced, whilst still keeping the space 25 necessary for distribution and collecting relatively small compared with the reception area 13. The air circulation can be chosen in such a way that the greatest air resistance only occurs in the vicinity of the plug-in cards 12, which ensures a uniform air distribution.

Even though in the represented embodiment the air distributor/collector 28, 29 are arranged above the reception area 13, a positioning below the same is also possible. It is then necessary to have an appropriate direction change of the cooling baffle and an adaptation of the ventilator arrangement.

As the air resistance is minimized by the inventive air circulation, it is possible to use ventilators which produce little noise. If the ventilator arrangement is provided in the upper part of the frame, as shown in the drawing, then via the lower space 25 an unimpeded access from the rear to the lower plug-in plane of the reception area 13 is possible.

What we claim is:

1. A ventilated storage assembly for electric circuit boards comprising at least two stacked like frames (10, 100) including a lower frame (10) and an upper frame (100), each frame comprising a base (14), a top (30), a front (15), a back (23) and sides, the base of the upper frame (100) being supported on the top (30) of the lower frame, each frame further including a front reception area (13, 13') at the front of the respective frame for vertically disposed circuit boards, each front reception area extending upwardly from the base of the respective frame, a first air inlet (16, 16') in the base of each frame communicating with the respective front reception area (13, 13'), an air opening (18) at the top of each front reception area aligned with the respective first air inlet, an air space (25) between the top of each front reception area and the top of the respective frame, a baffle (27) in each air space dividing the space into front (28) and rear (29) air passages, a second air inlet (26) in the front of each frame communicating with the respective front air passage (28), a first air outlet (34) from said front air passage (28) formed in the top of each frame in alignment with the respective first air inlet (16, 16'), a rear reception area (35) in each frame behind the respective front reception area and communicating with the respective rear air passage (29), each rear reception area extending from the top of the respective frame to a level below the top of the respective front reception area, a second air outlet in the back of each frame communicating with the respective rear reception area, and a fan (36, 36') associated with each second outlet for causing air to flow through the respective frame, the fan (36) of the lower frame being effective for causing air to flow through the first air inlet (16) of the lower frame, the front reception area (13) of the lower frame, the rear air passage (29) of the lower frame, the rear reception area (35) of the lower frame and the second air outlet of the lower frame, and the fan (36') of the upper frame being effective for causing air to flow through the second air inlet (26) of the lower frame, the front air passage (28) of the lower frame and the first air outlet (34) of the lower frame and hence through the first air inlet (16') of the upper frame, the front reception area (13') of the upper frame, the rear air passage of the upper frame, the rear reception area of the upper frame and the second air outlet of the upper frame.

2. An assembly as defined in claim 1 wherein said air space (25) of each frame has a height of one unit in a 19" circuit board system.

3. An assembly as defined in claim 1 wherein the baffle (27) of each frame is inclined.

4. An assembly as defined in claim 3 wherein the baffle (27) of each frame extends upwardly from the front of the air space at the top of the respective front reception area to the back of said first air outlet.

5. An assembly as defined in claim 1 wherein the rear reception area of each frame has a lower margin defined by a baffle (24) extending from the respective front reception area to the back of the respective frame substantially mid-way up the height of the front reception area.

* * * * *